(12) United States Patent
Takahashi et al.

(10) Patent No.: US 10,907,250 B2
(45) Date of Patent: Feb. 2, 2021

(54) BLOCK COPOLYMER PATTERN FORMATION METHOD AND DIFFRACTION LIMITED OPTICAL ELEMENT

(71) Applicant: Dexerials Corporation, Tokyo (JP)

(72) Inventors: Eiji Takahashi, Shimotsuke (JP); Akio Takada, Sendai (JP); Nobuyuki Koike, Tokyo (JP)

(73) Assignee: Dexerials Corporation, Tokyo (JP)

( * ) Notice: Subject to any disclaimer, the term of this patent is extended or adjusted under 35 U.S.C. 154(b) by 273 days.

(21) Appl. No.: 15/661,041

(22) Filed: Jul. 27, 2017

(65) Prior Publication Data

US 2018/0030592 A1 Feb. 1, 2018

(30) Foreign Application Priority Data

Jul. 29, 2016 (JP) ................................ 2016-150193

(51) Int. Cl.
*C23C 14/58* (2006.01)
*C23C 14/04* (2006.01)
*C23C 14/10* (2006.01)
*C23C 14/22* (2006.01)
*C23C 14/08* (2006.01)
*G02B 1/00* (2006.01)
(Continued)

(52) U.S. Cl.
CPC .......... *C23C 14/5806* (2013.01); *C23C 14/04* (2013.01); *C23C 14/06* (2013.01); *C23C 14/083* (2013.01); *C23C 14/10* (2013.01); *C23C 14/225* (2013.01); *C23C 14/58* (2013.01); *G02B 1/00* (2013.01); *G03F 7/0002* (2013.01)

(58) Field of Classification Search
CPC ................................................. C23C 14/5806
See application file for complete search history.

(56) References Cited

U.S. PATENT DOCUMENTS

| 2008/0230514 A1* | 9/2008 | Park | B01D 67/003 |
| | | | 216/41 |
| 2009/0135519 A1* | 5/2009 | Hieda | G11B 5/743 |
| | | | 360/110 |
| 2009/0239086 A1* | 9/2009 | Ishizuka | B05D 1/185 |
| | | | 428/447 |

FOREIGN PATENT DOCUMENTS

| JP | 2004099667 A | 4/2004 |
| KR | 2014052514 A1 * | 5/2014 |

OTHER PUBLICATIONS

Machine Translation of KR 1928980 B1 to Bae, as previously cited. Published May 2014 (Year: 2014).*

(Continued)

*Primary Examiner* — Jason Berman
(74) *Attorney, Agent, or Firm* — Kenja IP Law PC

(57) ABSTRACT

Provided are a block copolymer pattern formation method that enables formation, over a large area, of a block copolymer pattern with a perpendicularly oriented lamellar structure enabling nanoscale surface shape control, and a diffraction limited optical element produced using the block copolymer pattern formation method. The block copolymer pattern formation method is a method for forming a block copolymer pattern on a substrate and includes forming an oblique angle vapor deposited film on the substrate, applying a block copolymer onto the oblique angle vapor deposited film that has been formed, and subjecting the block copolymer that has been applied to perpendicularly oriented lamellar structure development post-treatment to form a pattern with a perpendicularly oriented lamellar structure.

8 Claims, 19 Drawing Sheets

(51) Int. Cl.
G03F 7/00 (2006.01)
C23C 14/06 (2006.01)

(56) References Cited

OTHER PUBLICATIONS

Eungnak Han et al., "Effect of Composition of Substrate-Modifying Random Copolymers on the Orientation of Symmetric and Asymmetric Diblock Copolymer Domains", Macromolecules, 2008, pp. 9090-9097, vol. 41, No. 23.
Feb. 4, 2020, Notification of Reasons for Refusal issued by the Japan Patent Office in the corresponding Japanese Patent Application No. 2016-150193.

* cited by examiner

BLOCK COPOLYMER PATTERN FORMATION METHOD AND DIFFRACTION LIMITED OPTICAL ELEMENT

CROSS-REFERENCE TO RELATED APPLICATION

This application claims priority to and the benefit of Japanese Patent Application No. 2016-150193 filed Jul. 29, 2016, the entire contents of which are incorporated herein by reference.

TECHNICAL FIELD

This disclosure relates to a block copolymer pattern formation method and a diffraction limited optical element.

BACKGROUND

A block copolymer is a polymer in which two or more types of polymer components are joined by covalent bonding. There are a wide variety of block copolymers with various numbers of polymer components. Among such copolymers, diblock copolymers are polymers in which two types of polymer components (polymer component A and polymer component B) are joined.

In a situation in which the different types of block polymer components in a block copolymer do not mix favorably with one another and phase separate, a microdomain structure is formed (i.e., microphase separation occurs). When a film of a block copolymer is formed directly on a base plate, a block polymer component having higher affinity with the base plate becomes aligned such as to be in contact with the base plate. For example, in a situation in which a polymer component A of a diblock copolymer has higher affinity with a base plate than a polymer component B of the diblock copolymer, the polymer component A and the polymer component B become aligned in a direction parallel to the base plate with the polymer component A and the polymer component B in this order from the base plate in a normal direction relative to the base plate (parallelly oriented lamellar structure). In order to use a block copolymer in a patterning process for fine structure formation, it is necessary to cause alignment of polymer components in a direction perpendicular to a base plate (perpendicularly oriented lamellar structure). In this manner, different types of polymer components can be arranged on the base plate surface and then a pattern can be formed, for example, using a plasma dry etching process by exploiting a difference in ease of etching (selectivity) of the polymer components.

In one known example of a conventionally used perpendicular orientation technique, as illustrated in FIG. 1, an intermediate layer 20 is formed on a substrate 10 (intermediate layer formation step), a block copolymer layer (pattern layer) 30 is formed on the formed intermediate layer 20, and the block copolymer layer (pattern layer) 30 is subjected to thermal annealing treatment or the like to cause phase separation (one polymer component 30a and another polymer component 30b) of the block copolymer layer (pattern layer) 30 and orient the block copolymer perpendicularly to the substrate 10. Moreover, a method in which any of various polymers is used as a material of the intermediate layer 20 formed between the substrate 10 and the block copolymer layer (pattern layer) 30 is widely used (for example, refer to NPL 1), but this method has problems in terms of cost and process stability.

Examples of perpendicular orientation techniques for block copolymer layers also include a method in which a base plate having a relief structure is used (for example, refer to PTL 1). This method involves a simple process and an inorganic material having high durability, such as ITO, Si, or $SiO_x$, can be used as a base plate surface material. However, in practice, it is necessary to adjust the molecular weight of the block copolymer to obtain a desired pattern size and there are also differences in terms of the level of surface roughness that is demanded. Accordingly, a problem with this method is that the molecular weight of the block copolymer has a narrow permissible range.

Pattern formation through base plate patterning by photolithography or the like and etching may also be considered, but in a situation in which pattern formation over a large area is necessary, such as for device applications, this method requires a difficult process and is also disadvantageous in terms of cost.

Therefore, there is demand for the development of a block copolymer pattern formation method that enables formation, over a large area, of a block copolymer pattern with a perpendicularly oriented lamellar structure enabling nanoscale surface shape control.

CITATION LIST

Patent Literature

PTL 1: JP 2004-99667 A

Non-Patent Literature

NPL 1: Eungnak Han et al., Macromolecules, 2008, 41, pp 9090-9097

SUMMARY

This disclosure aims to solve the various conventional problems set forth above and achieve the following objective. Specifically, an objective of this disclosure is to provide a block copolymer pattern formation method that enables formation, over a large area, of a block copolymer pattern with a perpendicularly oriented lamellar structure enabling nanoscale surface shape control, and a diffraction limited optical element produced using the block copolymer pattern formation method.

As a result of diligent investigation conducted to achieve this objective, the inventors discovered that by applying a block copolymer onto an oblique angle vapor deposited film formed on a substrate and then subjecting the applied block copolymer to perpendicularly oriented lamellar structure development post-treatment to form a pattern with a perpendicularly oriented lamellar structure, it is possible to form, over a large area, a block copolymer pattern with a perpendicularly oriented lamellar structure enabling nanoscale surface shape control, and thus the inventors completed the disclosed techniques.

This disclosure is based on the above findings made by the inventors and provides the following as a solution to the problems set forth above.

Specifically, this disclosure provides:

<1> A block copolymer pattern formation method for forming a block copolymer pattern on a substrate, comprising: forming an oblique angle vapor deposited film on the substrate; applying a block copolymer onto the oblique angle vapor deposited film that has been formed; and subjecting the block copolymer that has been applied to perpendicularly oriented lamellar structure development post-treatment to form a pattern with a perpendicularly oriented lamellar structure.

In the block copolymer pattern formation method according to the foregoing <1>, by applying the block copolymer onto the oblique angle vapor deposited film formed on the substrate and then subjecting the block copolymer that has been applied to perpendicularly oriented lamellar structure development post-treatment to form a pattern with a perpendicularly oriented lamellar structure, it is possible to form, over a large area, a block copolymer pattern with a perpendicularly oriented lamellar structure enabling nanoscale surface shape control.

<2> The block copolymer pattern formation method according to the foregoing <1>, wherein the perpendicularly oriented lamellar structure development post-treatment is energy imparting treatment or solvent annealing treatment.

<3> The block copolymer pattern formation method according to the foregoing <1> or <2>, wherein the energy imparting treatment is one selected from the group consisting of thermal annealing treatment, photoirradiation treatment, and voltage application treatment.

<4> The block copolymer pattern formation method according to the foregoing <1> or <2>, wherein the substrate includes one or more protruding portions, and in the forming of the oblique angle vapor deposited film, the oblique angle vapor deposited film is only formed on the protruding portions.

<5> The block copolymer pattern formation method according to any one of the foregoing <1> to <3>, wherein in the forming of the oblique angle vapor deposited film: the oblique angle vapor deposited film is layered repeatedly from two vapor deposition directions differing from each other by 180°; and a line-and-space pattern is formed at the surface of the oblique angle vapor deposited film that has been layered.

<6> The block copolymer pattern formation method according to the foregoing <4>, wherein the line-and-space pattern has a pitch of no greater than 100 nm.

<7> The block copolymer pattern formation method according to any one of the foregoing <1> to <5>, wherein the oblique angle vapor deposited film is a film formed from at least one selected from the group consisting of an oxide of Si, an oxide of Ta, and an oxide of Ti.

<8> The block copolymer pattern formation method according to any one of the foregoing <1> to <6>, further comprising ion milling the oblique angle vapor deposited film by irradiation with an ion beam after the forming of the oblique angle vapor deposited film.

<9> The block copolymer pattern formation method according to any one of the foregoing <1> to <7>, wherein the block copolymer is a diblock copolymer formed from two types of polymers.

<10> A diffraction limited optical element produced using a block copolymer pattern formed by the block copolymer pattern formation method according to any one of the foregoing <1> to <9>, the diffraction limited optical element comprising a substrate and an oblique angle vapor deposited film formed on the substrate, wherein a pattern of the oblique angle vapor deposited film is formed based on the block copolymer pattern.

In this specification, the term "oblique angle vapor deposited film" refers to, for example, an oblique angle vapor deposited film 60 that, as illustrated in FIG. 2, is formed by oblique angle vapor deposition in which a specific material described further below is vapor deposited using a vapor deposition source 50 positioned in an oblique direction relative to a substrate 10 that is positioned in a rotatable manner on a rotation mechanism 40 (in FIG. 2, the vapor deposition source 50 is positioned in a direction at an angle A from a normal direction relative to the substrate 10). Although the angle A is 70° in FIG. 2, the angle A is not limited to being 70°.

In this specification, the term "solvent annealing" refers to exposing a treatment target to vapor originating from a solvent such as to place molecules within the treatment target in a more mobile state.

According to this disclosure, it is possible to solve the conventional problems set forth above and provide a block copolymer pattern formation method that enables formation, over a large area, of a block copolymer pattern with a perpendicularly oriented lamellar structure enabling nanoscale surface shape control.

Moreover, according to this disclosure, it is possible to provide a diffraction limited optical element that is produced using this block copolymer pattern formation method.

DETAILED DESCRIPTION

Block Copolymer Pattern Formation Method

Figure 1:
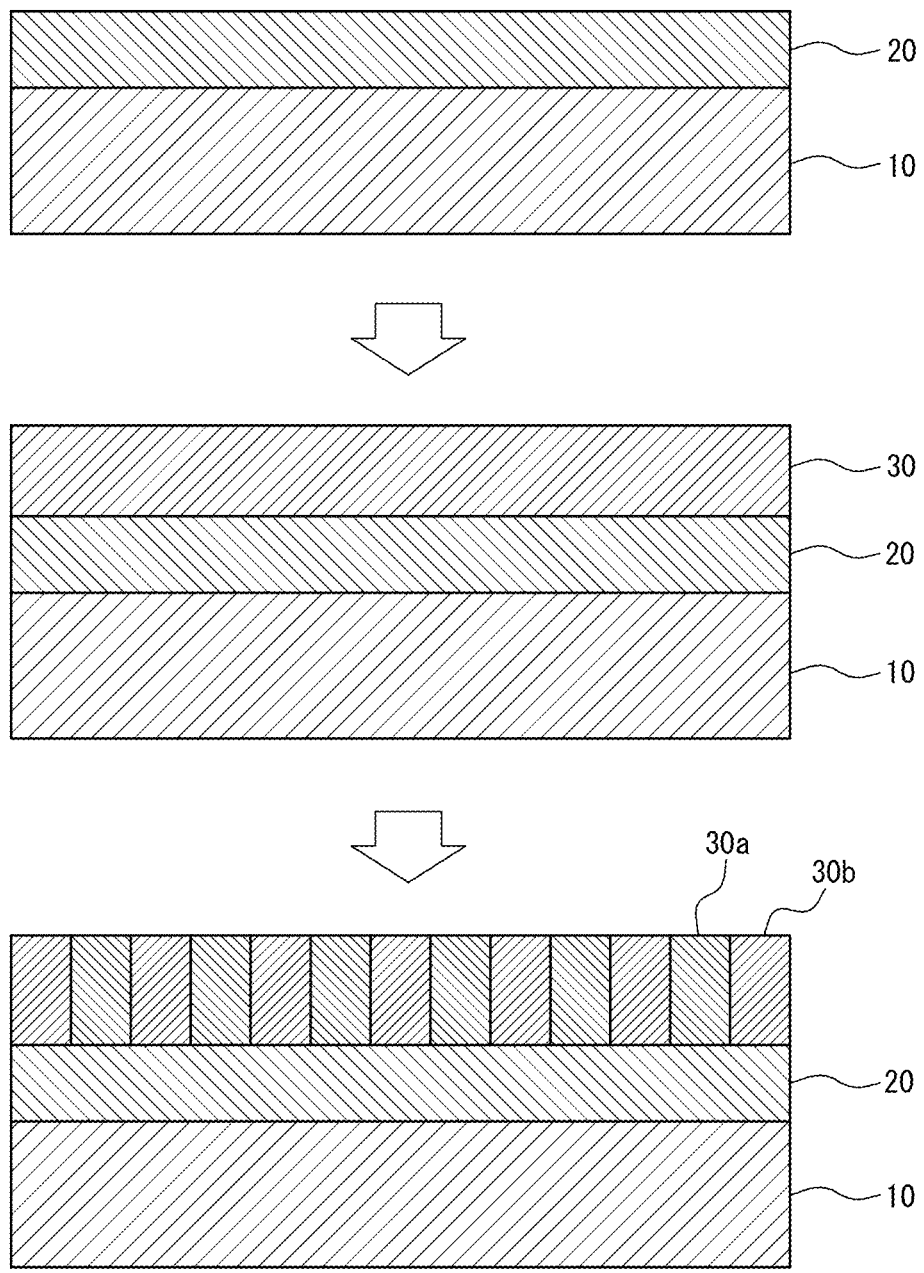
FIG. 1 is a schematic illustration of a conventional block copolymer pattern formation method.
Figure 2:
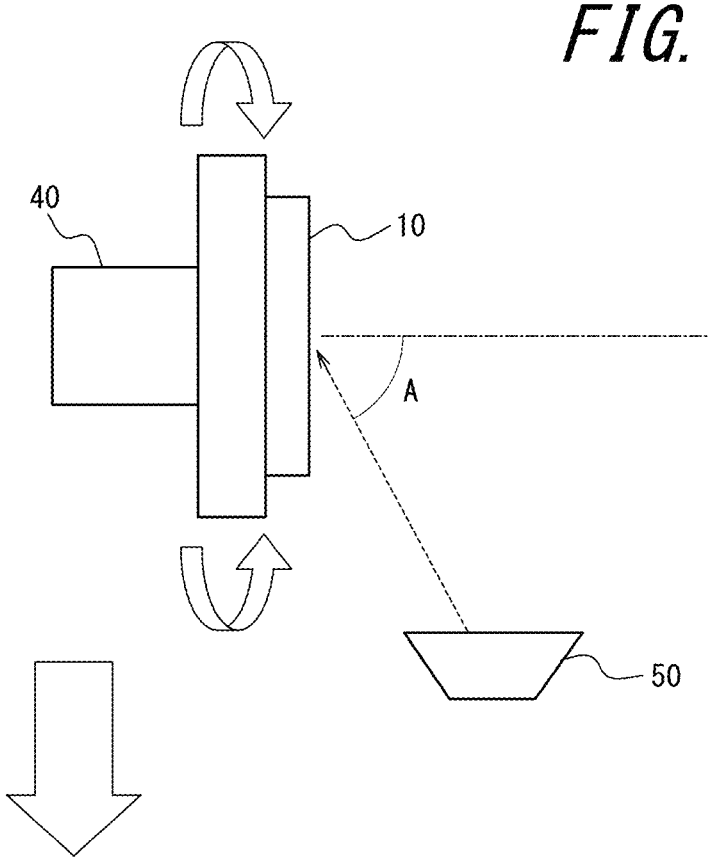
FIG. 2 is a schematic illustration of an oblique angle vapor deposition apparatus used in an oblique angle vapor deposited film formation step of a block copolymer pattern formation method according to a disclosed embodiment.
Figure 2:
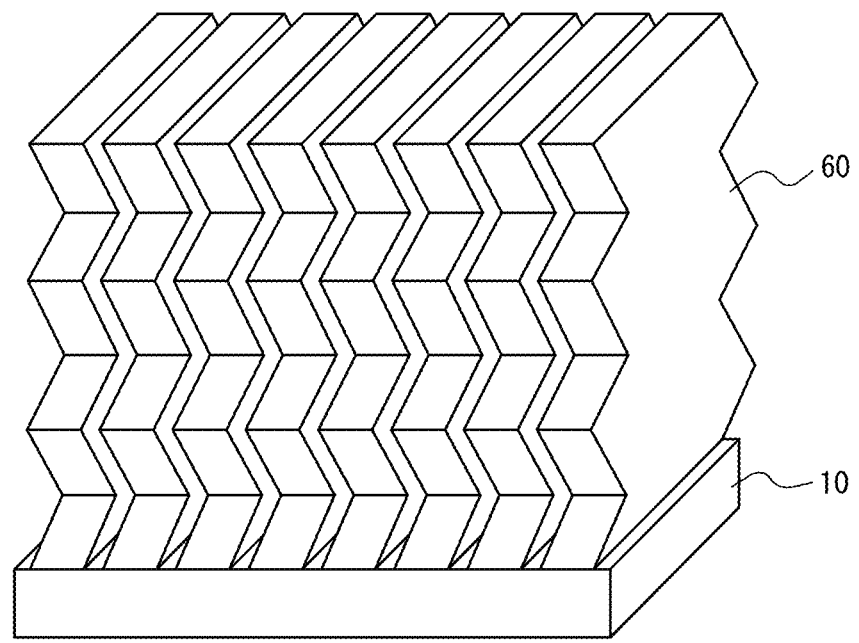

A block copolymer pattern formation method according to a disclosed embodiment includes at least an oblique angle vapor deposited film formation step, a block copolymer application step, and a pattern formation step, and may further include an ion milling step and other steps as necessary.

Oblique Angle Vapor Deposited Film Formation Step

The oblique angle vapor deposited film formation step is a step in which an oblique angle vapor deposited film is formed on a substrate.

Substrate

The substrate can be appropriately selected depending on the objective without any specific limitations and may, for example, be (i) a translucent base plate made from quartz, glass, crystal, sapphire, or the like, (ii) a metal base plate made from aluminum, iron, copper, or the like, or (iii) a ceramic base plate made from silicon, alumina, or the like.

The thickness of the substrate can be appropriately selected depending on the objective without any specific limitations, but is preferably 0.1 mm to 10 mm.

Oblique Angle Vapor Deposited Film

The oblique angle vapor deposited film can be selected as appropriate depending on the objective without any specific limitations, but typically exhibits birefringence and has a highly porous structure in order to obtain high birefringence, or is formed by a low-density columnar structure including gaps (i.e., subsequently described "air layers (groove portions)") in a specific volume ratio (for example, 20% to 30%).

The material of the oblique angle vapor deposited film can be appropriately selected depending on the objective without any specific limitations and may, for example, be an oxide such as an oxide of Si ($SiO_2$), an oxide of Ta ($Ta_2O_5$), or an oxide of Ti; or a metal such as titanium, germanium, or aluminum. Of these materials, an oxide of Si, an oxide of Ta, or an oxide of Ti is preferable in terms of ease of vapor deposition and neutralization with respect to the subsequently described block copolymer, and $SiO_2$ or $Ta_2O_5$ is more preferable in terms of being removable by tetrafluoromethane ($CF_4$) plasma.

Conventionally, a polymer layer has been used as a neutral layer formed on a substrate and, as a consequence, it has been necessary to adjust the molecular weight of the neutral layer (polymer layer) and the molecular weight of a pattern layer (block copolymer layer). However, the above-described oblique angle vapor deposited film is normally a film formed from an inorganic material that is not a polymer, and thus is advantageous in terms that it does not necessitate adjustment of the molecular weight of a pattern layer (block copolymer layer).

The thickness of the oblique angle vapor deposited film can be appropriately selected depending on the objective without any specific limitations, but is preferably 5 nm to 1000 nm.

Oblique Angle Vapor Deposited Film Formation Method

The method by which the oblique angle vapor deposited film is formed can be appropriately selected depending on the objective without any specific limitations and may, for example, be a method in which the oblique angle vapor deposited film is layered repeatedly from two vapor deposition directions differing from each other by 180°. Repeated layering from two vapor deposition directions that differ from each other by 180° enables efficient formation of an oblique angle vapor deposited film having a bundle structure (structure including "air layers (groove portions)" and "vapor deposited layers (protruding portions)") in which "air layers (groove portions)" are aligned in a specific direction.

Although two directions differing from each other by 180° are selected as vapor deposition directions in this example, the vapor deposition directions are not limited thereto. In other words, the number of vapor deposition directions may be greater than 2 and the angle between vapor deposition directions may be an angle other than 180°.

Moreover, a line-and-space pattern may be formed at the surface of the oblique angle vapor deposited film that has been layered. Herein, the term "line-and-space pattern" refers to a pattern in which recesses and protrusions (lines and spaces) are aligned (oriented) in a specific direction.

The pitch of the line-and-space pattern (total width of an "air layer (groove portion)" and a "vapor deposited layer (protruding portion)") can be appropriately selected depending on the objective without any specific limitations, but is preferably no greater than 100 nm. This is because production becomes difficult if the pitch is greater than 100 nm.

Moreover, the pitch of the line-and-space pattern is preferably a multiple or a factor of the pitch (periodicity) of the subsequently described block copolymer pattern with a perpendicularly oriented lamellar structure (i.e., equal to the pitch of the block copolymer pattern multiplied or divided by an integer), and is more preferably equal to the pitch (periodicity) of the block copolymer pattern.

Figure 4A:
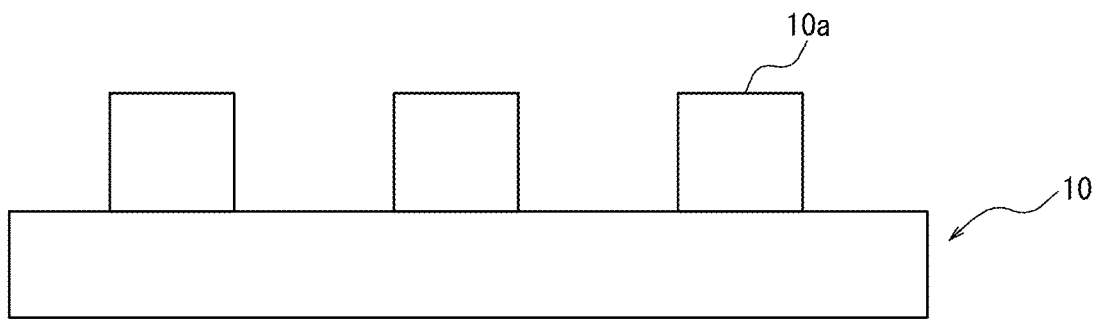
FIG. 4A is a schematic illustration (part 1) of another block copolymer pattern formation method according to a disclosed embodiment.
Figure 4B:
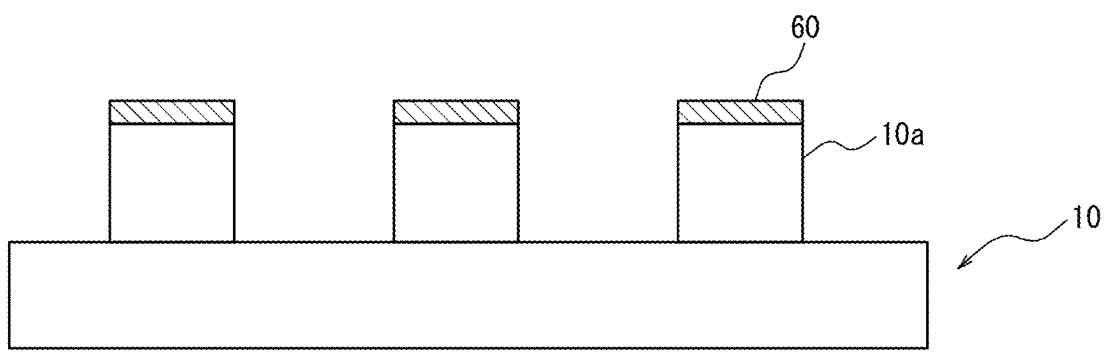
FIG. 4B is a schematic illustration (part 2) of the other block copolymer pattern formation method according to a disclosed embodiment.
Figure 4C:
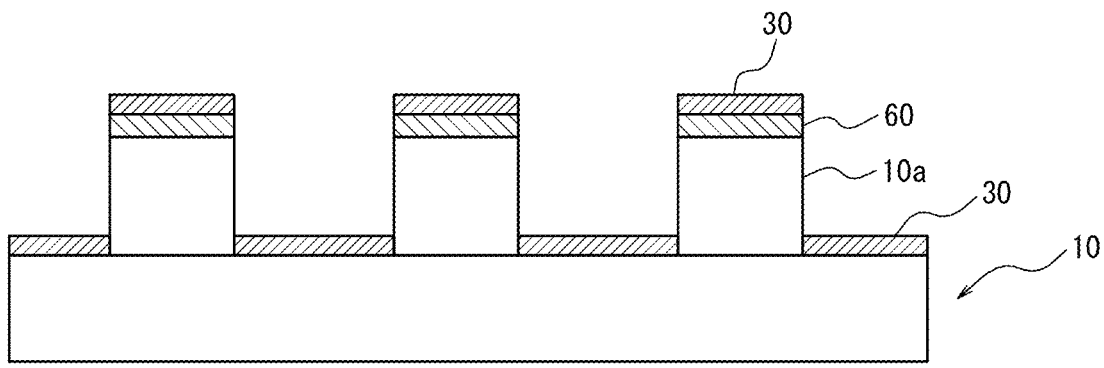
FIG. 4C is a schematic illustration (part 3) of the other block copolymer pattern formation method according to a disclosed embodiment.

As illustrated in FIGS. 4A to 4C, by using a shadowing effect to form an oblique angle vapor deposited film 60 on only protruding portions (protruding pattern 10a in FIG. 4A) of a substrate 10 (FIG. 4B) and then forming a layer 30 formed from a block copolymer (FIG. 4C), it is possible to form a pattern with a perpendicularly oriented lamellar structure only at portions where the oblique angle vapor deposited film 60 has been formed on the protruding pattern 10a (i.e., at desired positions on the substrate 10).

Block Copolymer Application Step

The block copolymer application step is a step in which a block copolymer is applied onto the oblique angle vapor deposited film that has been formed.

Block Copolymer

The block copolymer can be appropriately selected depending on the objective without any specific limitations, but is preferably a diblock copolymer formed from two types of polymers. This is because a diblock copolymer is appropriate for forming a line-and-space pattern, whereas a three-dimensional structure is obtained if a triblock copolymer formed from three types of polymers is used as the block copolymer.

Diblock Copolymer

The diblock copolymer can be appropriately selected depending on the objective without any specific limitations and may, for example, be a block copolymer PS-b-PMMA of polystyrene (PS) and poly(methyl methacrylate) (PMMA) or a block copolymer PS-b-PDMS of polystyrene (PS) and polydimethylsiloxane (PDMS). Of these diblock copolymers, PS-b-PMMA is preferable in terms of having good solubility in a solvent, which allows simple thin-film formation, and in terms that a perpendicularly oriented lamellar structure can be easily obtained therewith.

Block Copolymer Application Method

The method by which the block copolymer is applied can be appropriately selected depending on the objective without any specific limitations and may, for example, be a method in which PS-b-PMMA is diluted with an organic solvent such as toluene and is then applied by spin coating (spin casting) or the like.

The spin coating (spin casting) conditions can be appropriately selected depending on the objective without any specific limitations, but conditions of approximately 3000 rpm to 6000 rpm and approximately 15 seconds to 60 seconds are preferable. The thickness of a layer formed from the block copolymer can be adjusted through adjustment of the concentration of the organic solvent, the spin coating (spin casting) conditions, and so forth. The thickness of the layer formed from the block copolymer is preferably adjusted in accordance with the number average molecular weight of the block copolymer. For example, PS-b-PMMA having a number average molecular weight of approximately 160,000 has a periodicity of 80 nm, and thus the thickness is preferably approximately 40 nm, which is about half of this periodicity, or is preferably 80 nm or 160 nm, which are multiples of this periodicity (i.e., equal to the periodicity multiplied by an integer). Since the periodicity of the block copolymer changes depending on the number average molecular weight of the block copolymer, the thickness of the layer formed from the block copolymer is preferably adjusted as appropriate. In a situation in which PS-b-PMMA is used as the block copolymer, the number average molecular weight of the PS-b-PMMA is preferably approximately 50,000 to 1,000,000.

Pattern Formation Step

The pattern formation step is a step in which the block copolymer that has been applied is subjected to perpendicularly oriented lamellar structure development post-treatment to form a pattern with a perpendicularly oriented lamellar structure.

Perpendicularly Oriented Lamellar Structure Development Post-Treatment

The perpendicularly oriented lamellar structure development post-treatment can be appropriately selected depending on the objective without any specific limitations and may, for example, be energy imparting treatment or solvent annealing treatment. Of these treatments, energy imparting treatment is preferable as this allows a production process that does not use an organic solvent and has minimal environmental impact.

Energy Imparting Treatment

The energy imparting treatment can be appropriately selected depending on the objective without any specific limitations and examples thereof include thermal annealing treatment, photoirradiation treatment, and voltage application treatment. Of these treatments, thermal annealing treatment is preferable because a simple treatment method and ordinary equipment can be used.

Thermal Annealing Treatment

The thermal annealing treatment can be appropriately selected depending on the objective without any specific limitations. For example, thermal annealing treatment may be performed for approximately 6 hours to 18 hours at approximately 200° C. to 400° C. under vacuum conditions of approximately 10 kPa or lower.

Photoirradiation Treatment

The light that is irradiated in the photoirradiation treatment can be appropriately selected depending on the objective without any specific limitations and examples thereof include visible light, infrared light, and ultraviolet light.

The irradiation intensity in the photoirradiation treatment can be appropriately selected depending on the objective without any specific limitations.

Likewise, the irradiation time in the photoirradiation treatment can be appropriately selected depending on the objective without any specific limitations.

Voltage Application Treatment

In the voltage application treatment, a voltage is applied to a block copolymer that has been applied onto a base plate to thereby orient the block copolymer in the voltage direction. For example, the base plate may be used as an electrode and an electrolytic solution may be applied onto the block copolymer, and then a specific voltage may be applied therebetween (for example, refer to JP 4297831 B).

The applied voltage in the voltage application treatment can be appropriately selected depending on the objective without any specific limitations.

Likewise, the application time in the voltage application treatment can be appropriately selected depending on the objective without any specific limitations.

Solvent Annealing Treatment

The solvent annealing treatment can be appropriately selected depending on the objective without any specific limitations. For example, the solvent annealing treatment may be treatment such as described in "Yasuhiko Tada et al., Macromolecules, 2012, 45, pp 292-304" in which nitrogen is supplied into a tightly sealed stainless steel vessel containing a solvent and the vapor pressure (block copolymer film thickness) is controlled.

The solvent used in the solvent annealing treatment can be appropriately selected depending on the objective without any specific limitations, but is preferably a solvent in which the polymer components of the block copolymer display roughly the same degree of swelling. In a situation in which the polymer components of the block copolymer are PS and PMMA, examples of solvents in which these polymer components display roughly the same degree of swelling include tetrahydrofuran and acetone.

Since the surface of the applied block copolymer tends to become rougher when solvent annealing treatment is performed, it is preferable that the solvent annealing treatment is followed by heat treatment. The heat treatment is preferably performed for 10 minutes to 600 minutes at 200° C. to 300° C.

Pattern with Perpendicularly Oriented Lamellar Structure

Figure 3A:
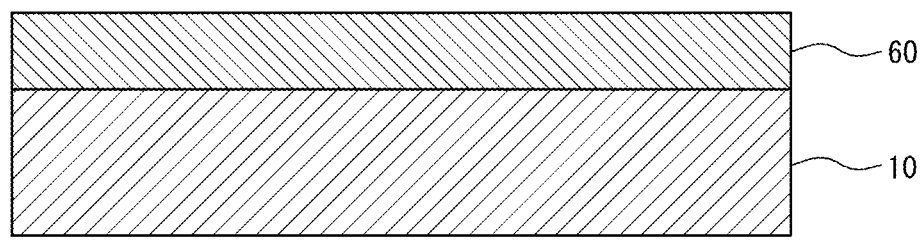
FIG. 3A is a schematic illustration (part 1) of a block copolymer pattern formation method according to a disclosed embodiment.
Figure 3B:
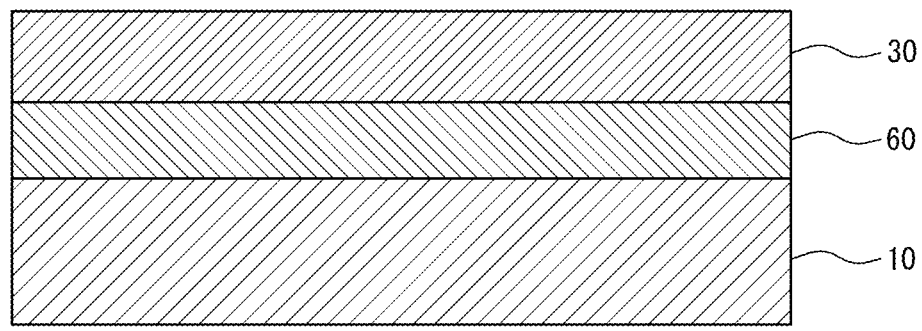
FIG. 3B is a schematic illustration (part 2) of the block copolymer pattern formation method according to a disclosed embodiment.
Figure 3C:
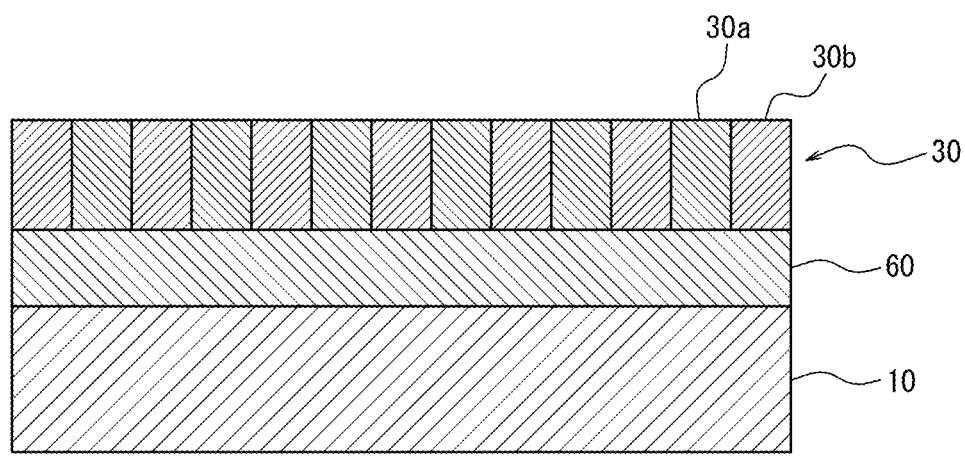
FIG. 3C is a schematic illustration (part 3) of the block copolymer pattern formation method according to a disclosed embodiment.

As illustrated in FIG. 3C, the pattern with a perpendicularly oriented lamellar structure is a pattern layer 30 formed through phase separation of one polymer component 30*a* (for example, PMMA) of the block copolymer and another polymer component 30*b* (for example, PS) of the block copolymer. The pattern layer 30 is oriented perpendicularly relative to the substrate 10.

Figure 5:
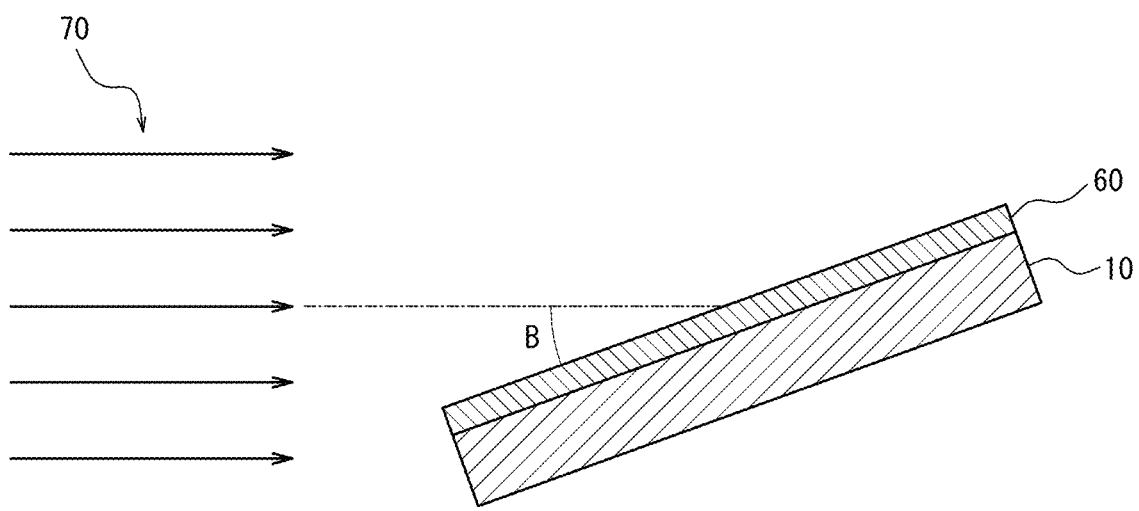
FIG. 5 is a schematic illustration of an ion milling step in a block copolymer pattern formation method according to a disclosed embodiment.

Moreover, the degree of alignment (orientation) of the oblique angle vapor deposited film 60 formed on the substrate 10 may be increased by, for example, performing subsequently described ion milling treatment or the like as illustrated in FIG. 5. Note that by selecting the type of material used as the oblique angle vapor deposited film 60, it is possible to intentionally select a polymer component that is formed on the "air layers (groove portions)" of the oblique angle vapor deposited film 60 and another polymer component that is formed on the "vapor deposited layers (protruding portions)" of the oblique angle vapor deposited film 60.

Ion Milling Step

The ion milling step is a step in which the surface of the oblique angle vapor deposited film is irradiated with an ion beam after the oblique angle vapor deposited film formation step.

The ion milling can be performed more efficiently by irradiating the surface of the oblique angle vapor deposited film with an ion beam that is parallel to a pattern alignment direction of the vapor deposited layers (protruding portions) of the oblique angle vapor deposited film.

For example, it was discovered that through the ion milling, the vapor deposited film having improved orientation relative to the block copolymer can act as an induced self-assembly guide pattern for the block copolymer.

Ion Beam Irradiation

Irradiating the oblique angle vapor deposited film 60 with an ion beam 70 as illustrated in FIG. 5 can increase the width of the "air layers (groove portions)" in the bundle structure of the oblique angle vapor deposited film 60 and improve alignment (orientation).

In FIG. 5, Ar ions are irradiated for 180 seconds at an angle of incidence B (20°) relative to the oblique angle vapor deposited film 60, but this is not a limitation.

The angle of incidence B of the ion beam irradiation can be appropriately selected depending on the objective without any specific limitations, but is preferably no greater than 45°.

The ions used for this ion beam irradiation can be appropriately selected depending on the objective without any specific limitations and may, for example, be Ar ions, Xe ions, or Kr ions. Of these ions, Ar ions are preferable since they are widely used in ion milling apparatuses for electronic devices and the like.

The ion beam irradiation time can be appropriately selected depending on the objective without any specific limitations, but is preferably 10 seconds to 300 seconds.

Diffraction Limited Optical Element

The presently disclosed diffraction limited optical element is produced using a block copolymer pattern formed by the presently disclosed block copolymer pattern formation method. The presently disclosed diffraction limited optical element includes a substrate and an oblique angle vapor deposited film formed on the substrate, wherein a pattern of the oblique angle vapor deposited film is formed based on the block copolymer pattern.

Figure 6A:
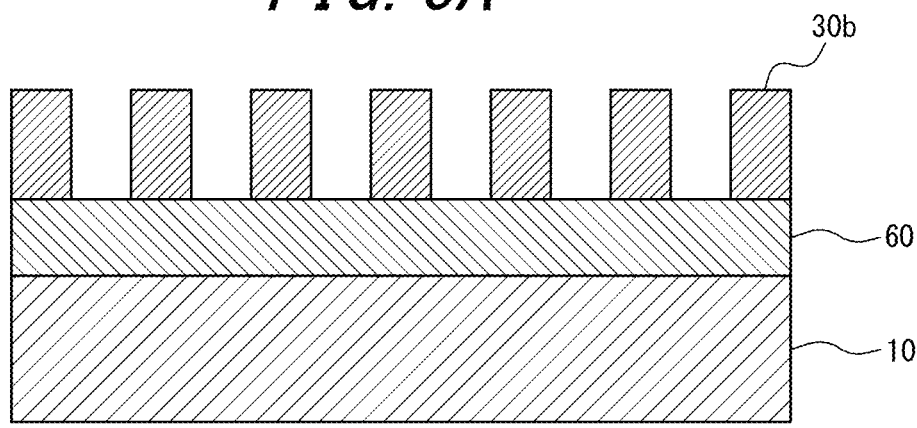
FIG. 6A is a schematic illustration (part 1) of a method of producing a diffraction limited optical element according to a disclosed embodiment.
Figure 6B:
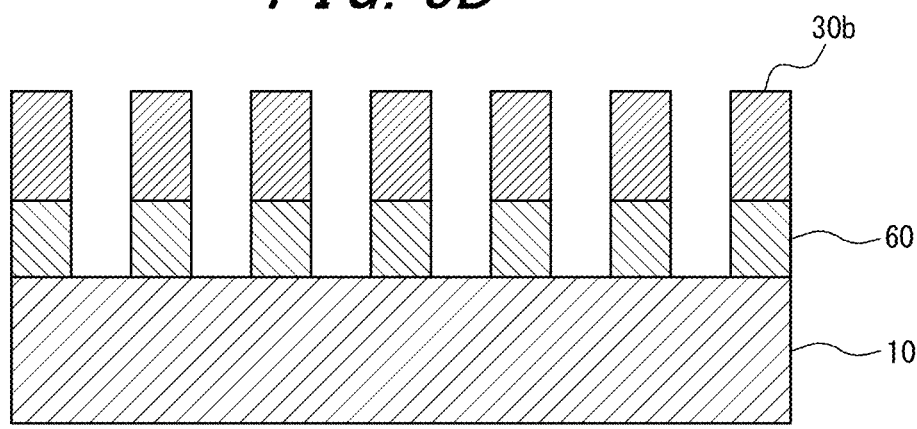
FIG. 6B is a schematic illustration (part 2) of the method of producing a diffraction limited optical element according to a disclosed embodiment.
Figure 6C:
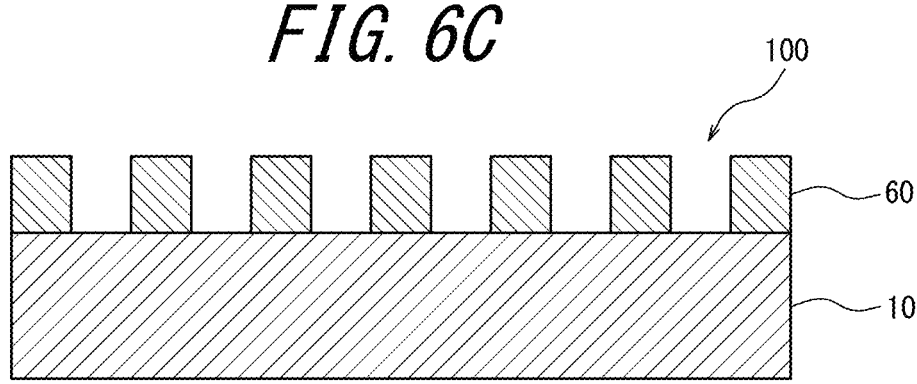
FIG. 6C is a schematic illustration (part 3) of the method of producing a diffraction limited optical element according to a disclosed embodiment.

The diffraction limited optical element may, for example, be produced by the following production method. First, only the polymer component 30*a* (for example, PMMA) of the block copolymer pattern layer 30 with a perpendicularly oriented lamellar structure (FIG. 3C) is removed by $O_2$ ashing or the like to leave the other polymer component 30*b* (for example, PS) of the block copolymer (FIG. 6A). Next, etching is performed to remove a portion of the oblique angle vapor deposited film 60 in a state in which the other polymer component 30*b* remains (FIG. 6B). The other polymer component 30*b* (for example, PS) is then removed by $O_2$ ashing or the like. In this manner, a diffraction limited optical element 100 is produced that includes the substrate 10 and a portion of the oblique angle vapor deposited film 60 formed on the substrate 10, and in which a pattern of the oblique angle vapor deposited film 60 has been formed based on the block copolymer pattern.

EXAMPLES

The following provides a more specific description of the disclosed techniques through examples and comparative examples. However, the disclosed techniques are not limited to the following examples.

Example 1

Figure 7A:
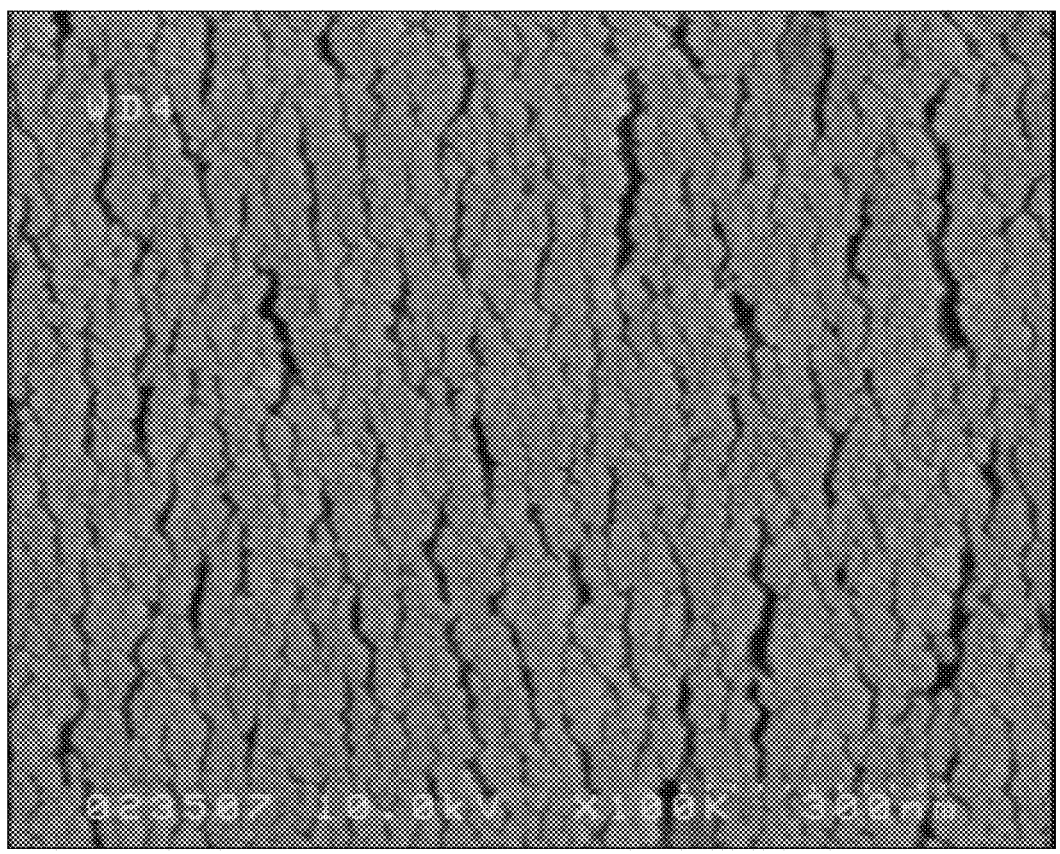
FIG. 7A is a scanning electron microscope (SEM) image of the surface of an oblique angle vapor deposited film formed in Example 1.
Figure 7B:
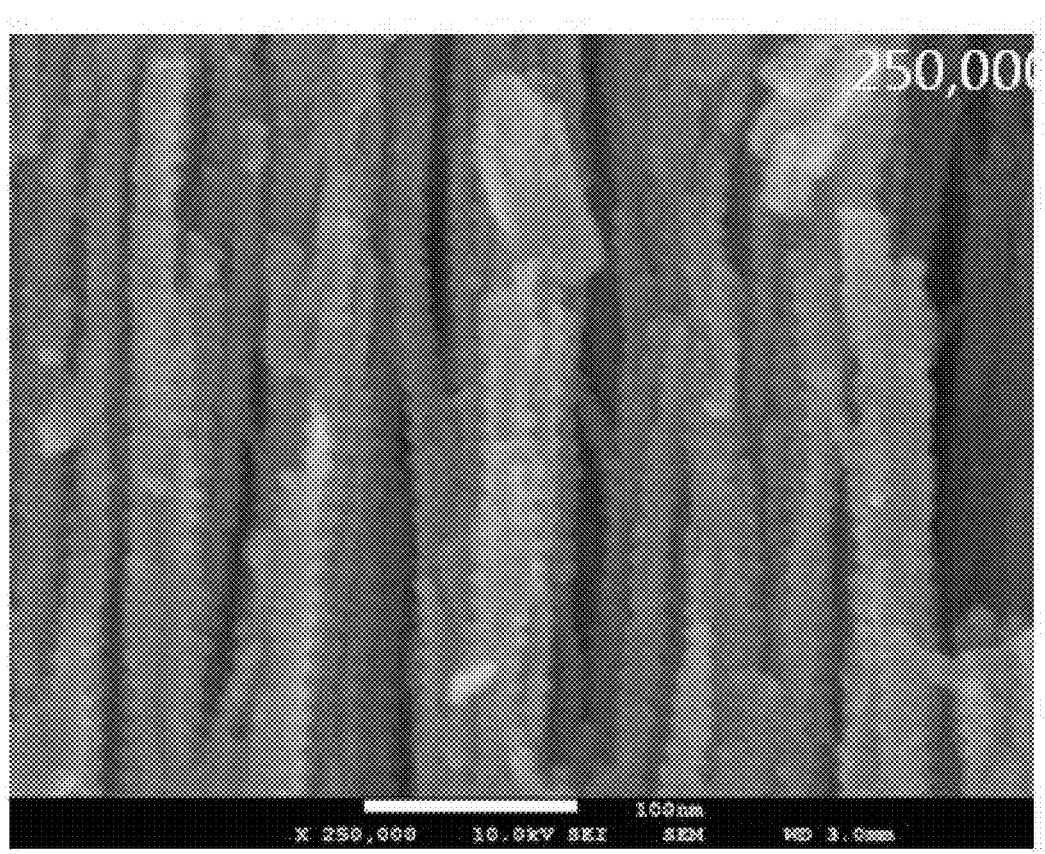
FIG. 7B is an SEM image of a cross-section of the oblique angle vapor deposited film formed in Example 1.
Figure 8:
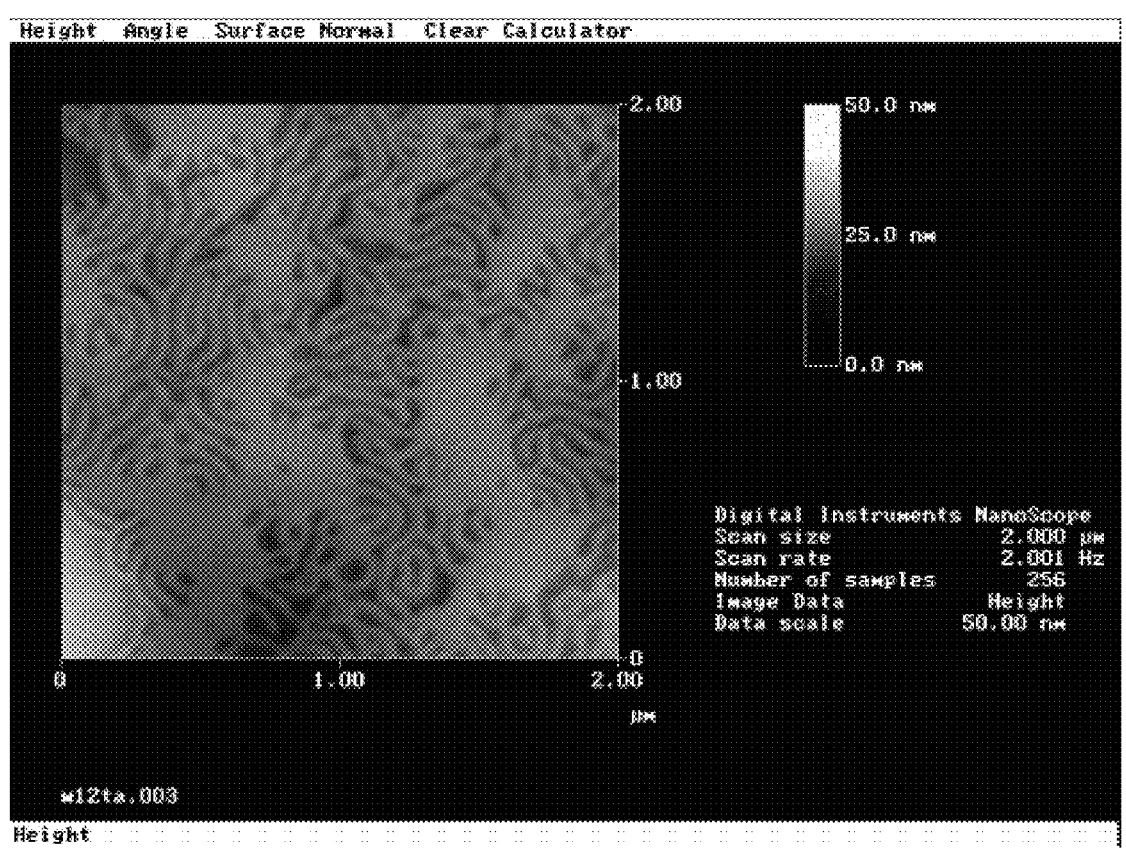
FIG. 8 is an atomic force microscope (AFM) image of the surface of a pattern with a perpendicularly oriented lamellar structure formed in Example 1.

First, an oblique angle vapor deposited film was formed by vapor depositing $Ta_2O_5$ on the surface of a glass base plate by oblique angle vapor deposition from directions differing by 180° to obtain a 20-layer bundle structure (FIGS. 7A and 7B). The angle of oblique angle vapor deposition was 70° relative to a normal to the glass base plate. A toluene solution (concentration: 1.25 mass %) of PS-b-PMMA (number average molecular weight: 66,000) was applied onto the formed vapor deposited film by spin coating (4000 rpm, 30 seconds) to form a block copolymer layer of 44.1 nm in thickness. The block copolymer layer was subjected to thermal annealing treatment for 12 hours at 240° C. under vacuum conditions to form a pattern with a perpendicularly oriented lamellar structure. FIG. 8 is an AFM image of the surface of the pattern with a perpendicularly oriented lamellar structure that was formed.

Note that the size of "air layers (groove portions, gaps)" in the oblique angle vapor deposited film can be adjusted by altering the angle, direction, and number of repetitions of oblique angle vapor deposition.

Example 2

Figure 9:
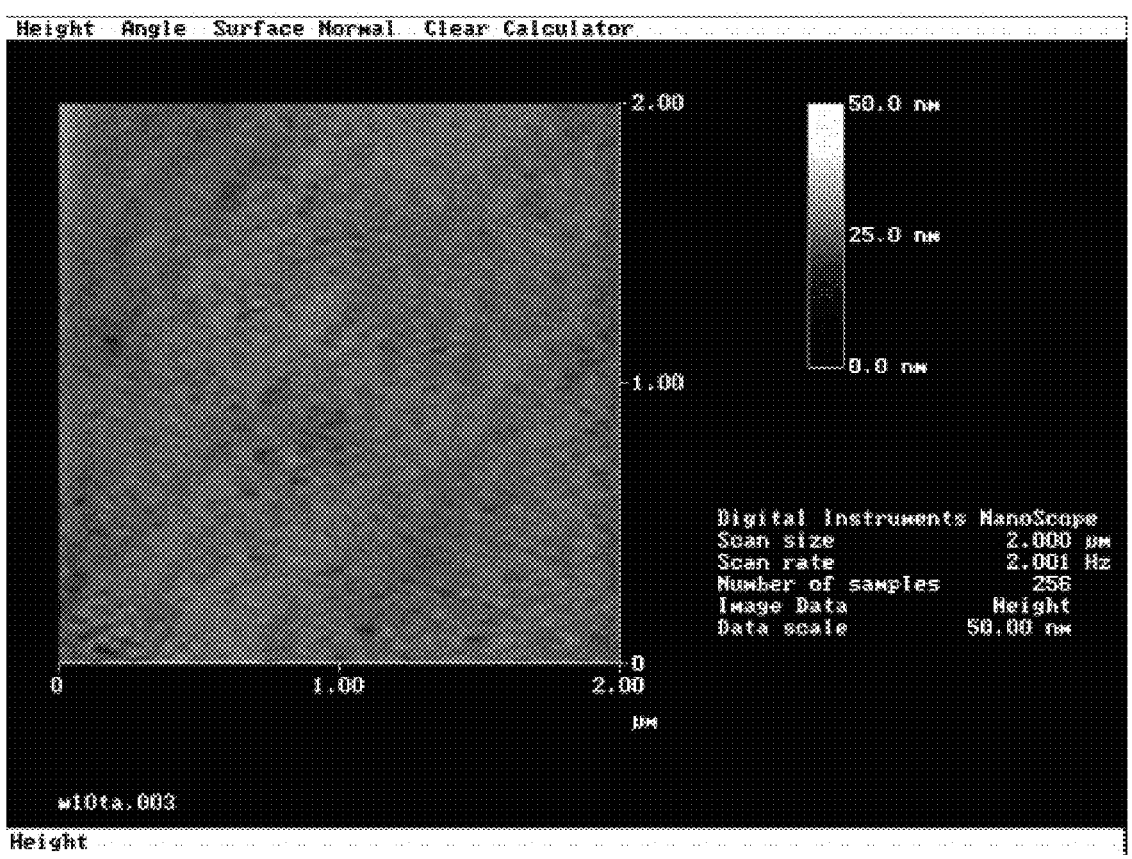
FIG. 9 is an AFM image of the surface of a pattern with a perpendicularly oriented lamellar structure formed in Example 2.

A pattern with a perpendicularly oriented lamellar structure was formed in the same way as in Example 1 with the exception that a toluene solution (concentration: 1.0 mass %) of PS-b-PMMA was applied by spin coating to form a block copolymer layer of 21.2 nm in thickness instead of applying a toluene solution (concentration: 1.25 mass %) of PS-b-PMMA by spin coating to form a block copolymer layer of 44.1 nm in thickness as in Example 1. FIG. 9 is an AFM image of the surface of the pattern with a perpendicularly oriented lamellar structure that was formed.

Example 3

Figure 10:
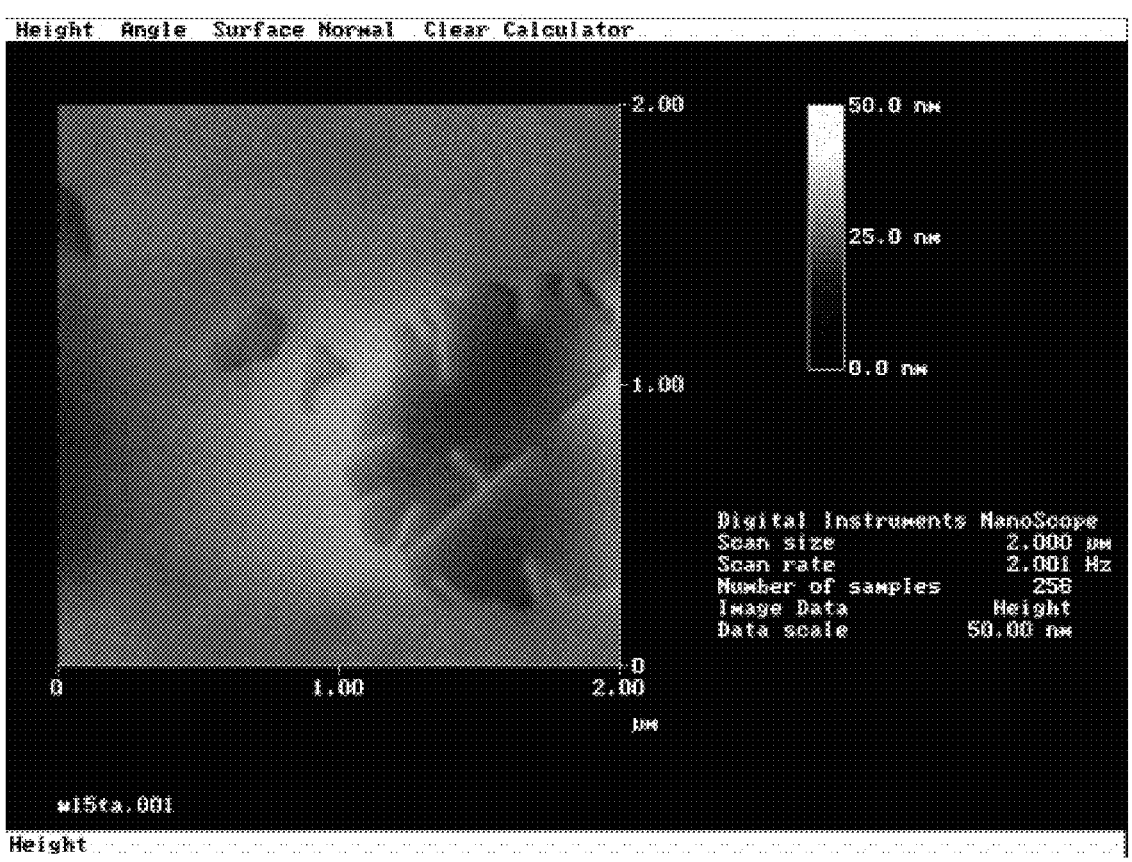
FIG. 10 is an AFM image of the surface of a pattern with a perpendicularly oriented lamellar structure formed in Example 3.

A pattern with a perpendicularly oriented lamellar structure was formed in the same way as in Example 1 with the exception that a toluene solution (concentration: 1.5 mass %) of PS-b-PMMA was applied by spin coating to form a block copolymer layer of 71.4 nm in thickness instead of applying a toluene solution (concentration: 1.25 mass %) of PS-b-PMMA by spin coating to form a block copolymer layer of 44.1 nm in thickness as in Example 1. FIG. 10 is an AFM image of the surface of the pattern with a perpendicularly oriented lamellar structure that was formed.

Example 4

Figure 11:
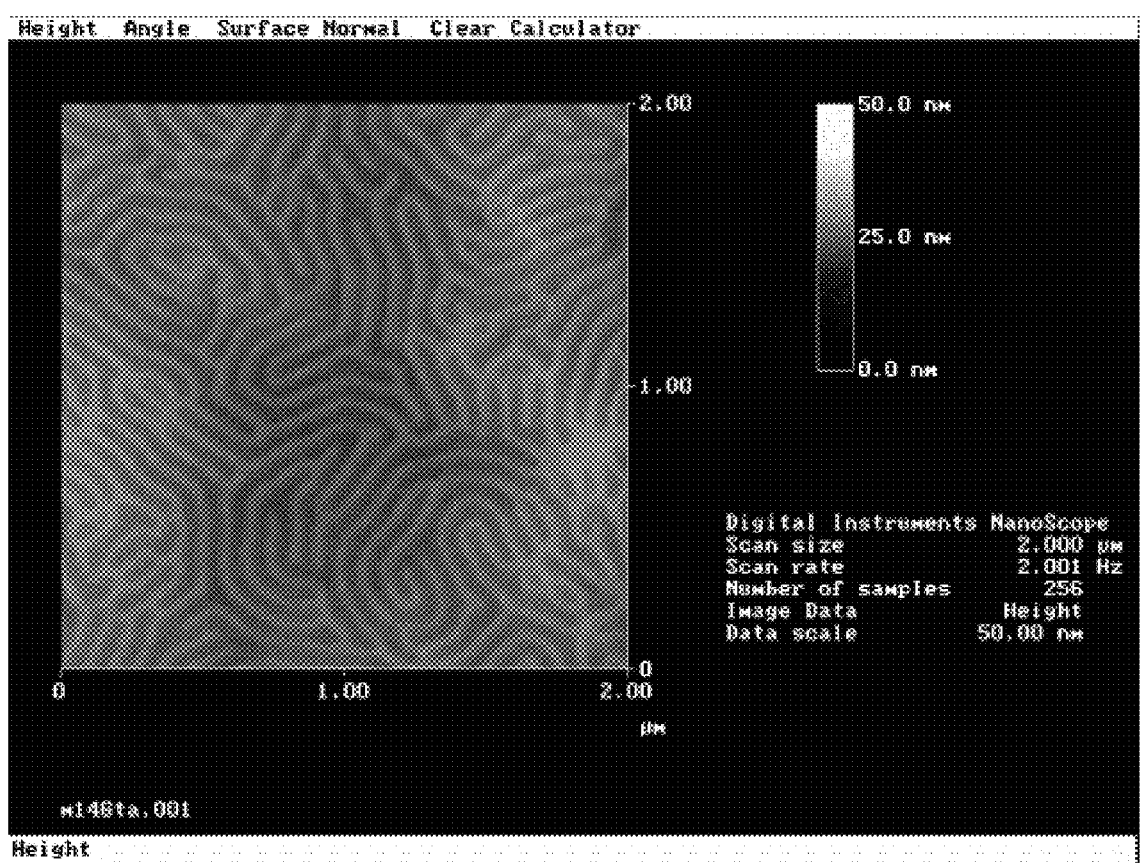
FIG. 11 is an AFM image of the surface of a pattern with a perpendicularly oriented lamellar structure formed in Example 4.

A pattern with a perpendicularly oriented lamellar structure was formed in the same way as in Example 1 with the exception that a toluene solution (concentration: 1.5 mass %) of PS-b-PMMA (number average molecular weight: 160,000) was applied by spin coating to form a block copolymer layer of 77.3 nm in thickness instead of applying a toluene solution (concentration: 1.25 mass %) of PS-b-PMMA (number average molecular weight: 66,000) by spin coating to form a block copolymer layer of 44.1 nm in thickness as in Example 1. FIG. 11 is an AFM image of the surface of the pattern with a perpendicularly oriented lamellar structure that was formed.

Example 5

Figure 12:
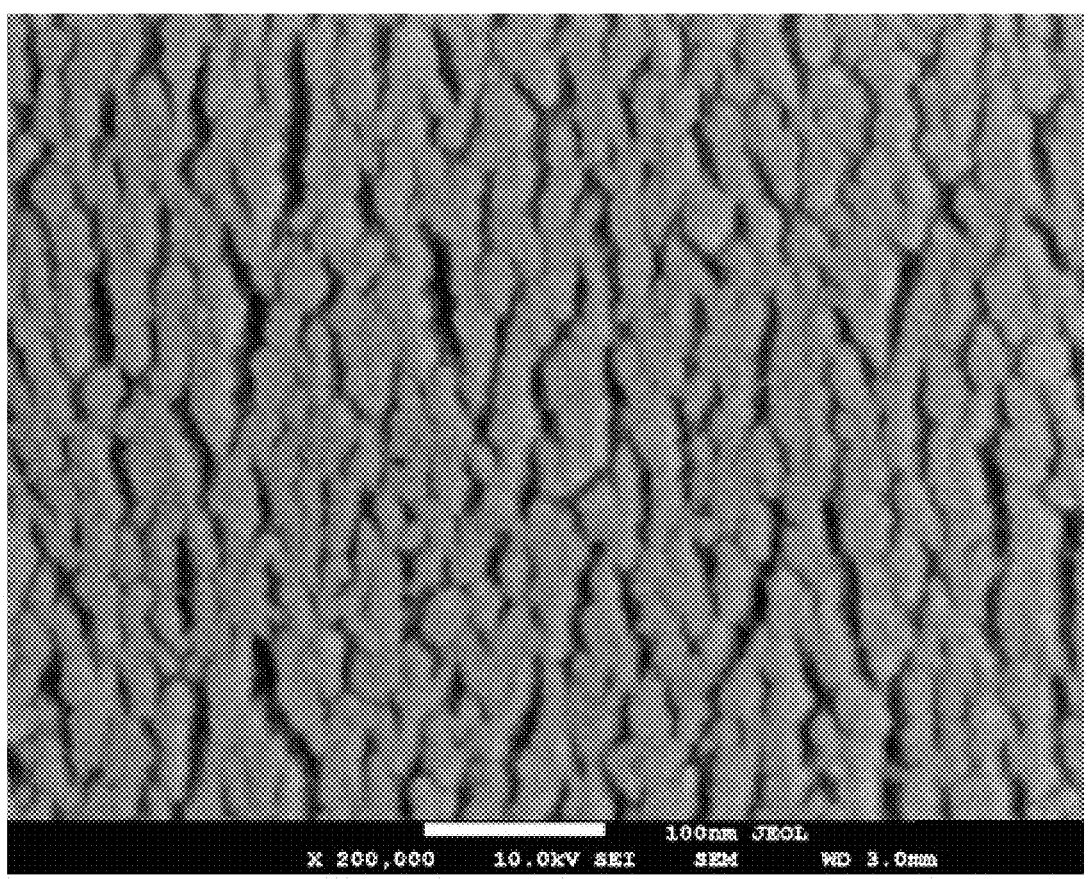
FIG. 12 is an SEM image of the surface of an oblique angle vapor deposited film (prior to ion milling) formed in Example 5.
Figure 13:
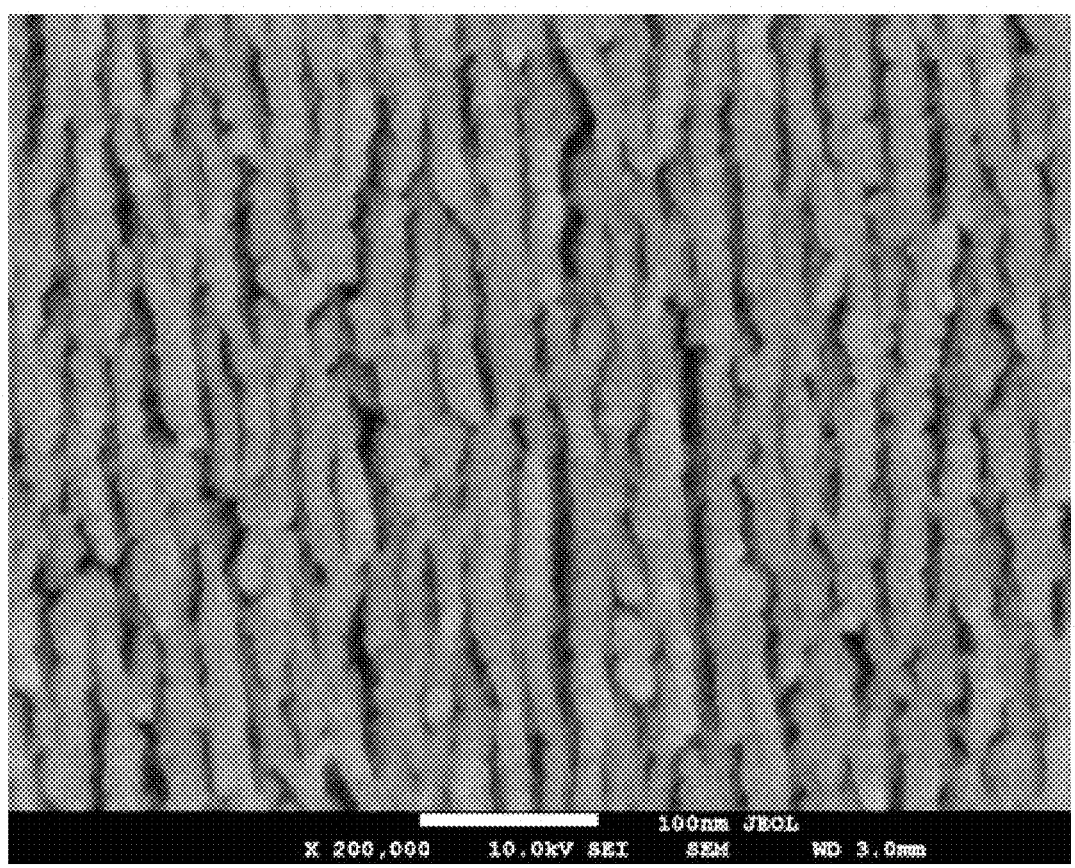
FIG. 13 is an SEM image of the surface of the oblique angle vapor deposited film (after 90 seconds of ion irradiation) formed in Example 5.
Figure 14:
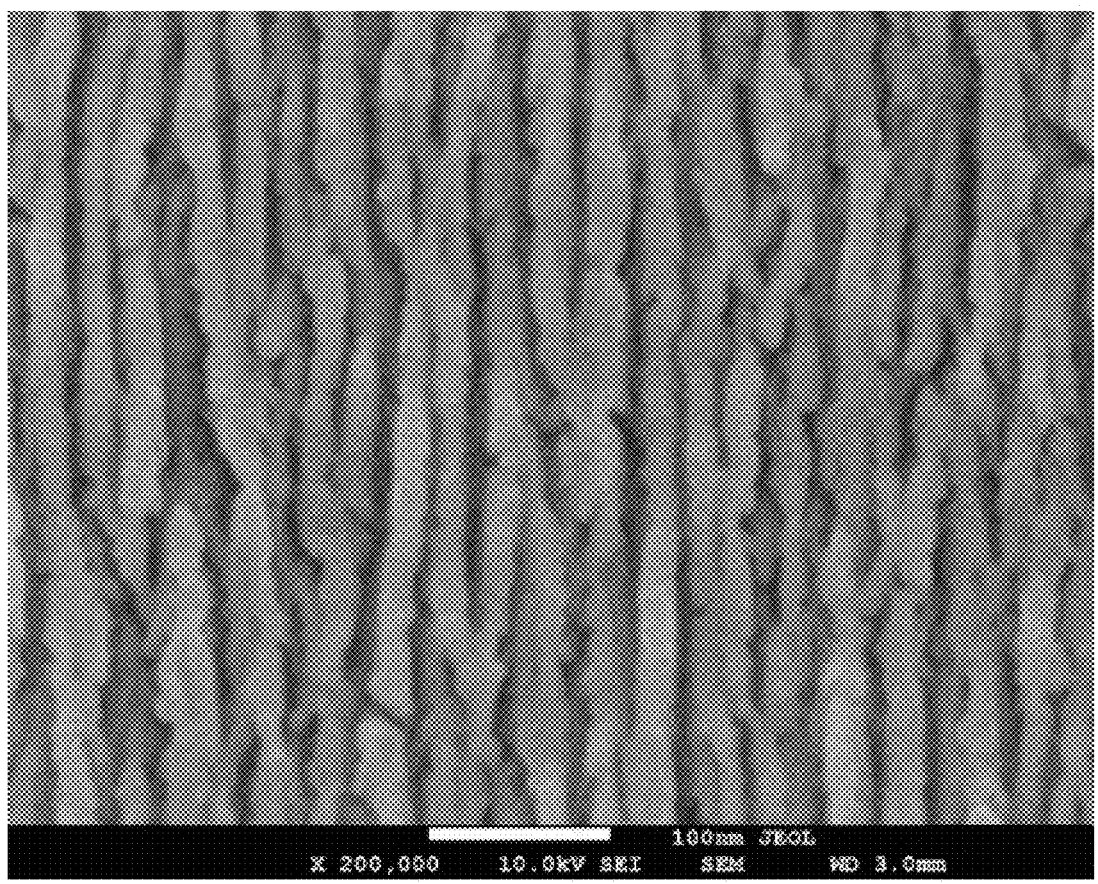
FIG. 14 is an SEM image of the surface of the oblique angle vapor deposited film (after 180 seconds of ion irradiation) formed in Example 5.

When the oblique angle vapor deposited film formed in Example 1 was irradiated with argon (Ar) ions for 180 seconds at an angle of incidence of 20°, the characteristic surface roughness qR became 3 times that of prior to treatment. FIG. 12 is an SEM image of the surface of the oblique angle vapor deposited film prior to ion irradiation, FIG. 13 is an SEM image of the surface of the oblique angle vapor deposited film after 90 seconds of ion irradiation, and FIG. 14 is an SEM image of the surface of the oblique angle vapor deposited film after 180 seconds of irradiation. This indicates that interfacial free energy between the oblique angle vapor deposited film surface and the block copolymer layer and interfacial free energy between the two types of polymers in the block copolymer layer increase, and there is progress toward development of a perpendicularly oriented lamellar structure (i.e., toward lower free energy).

Example 6

Figure 15:
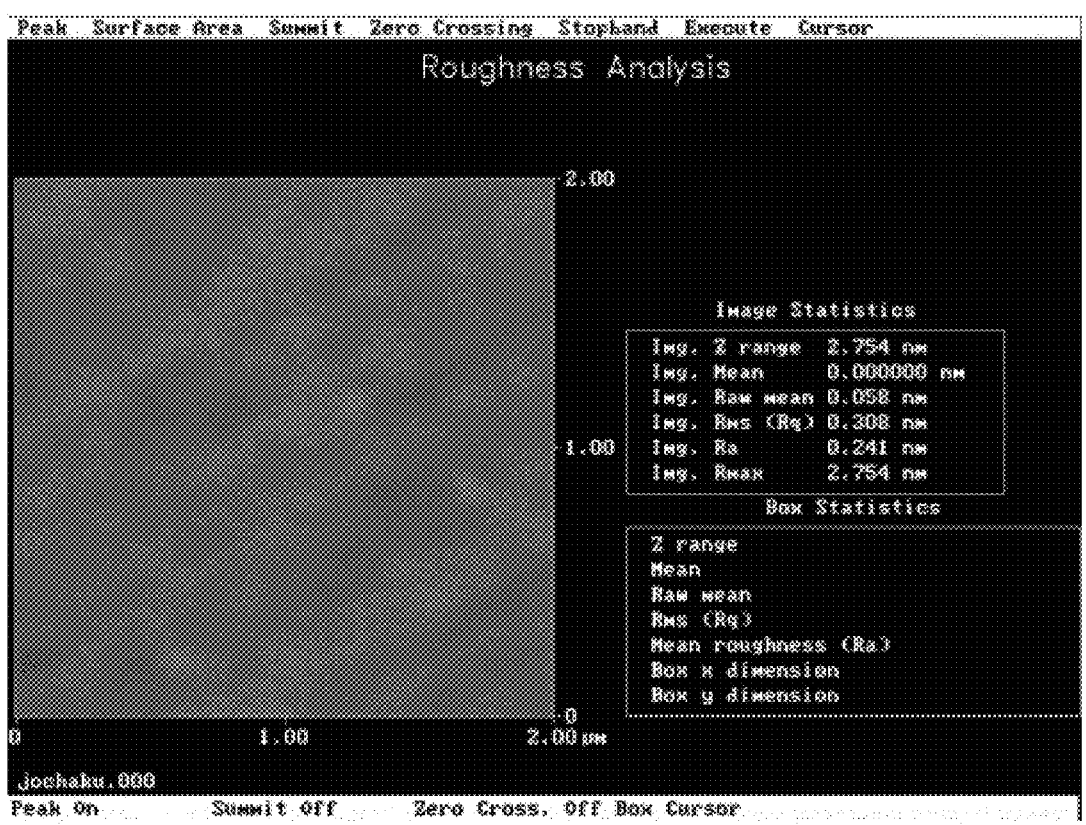
FIG. 15 is an AFM image of the surface of an oblique angle vapor deposited film having a pitch of 27 nm in Example 6.
Figure 16:
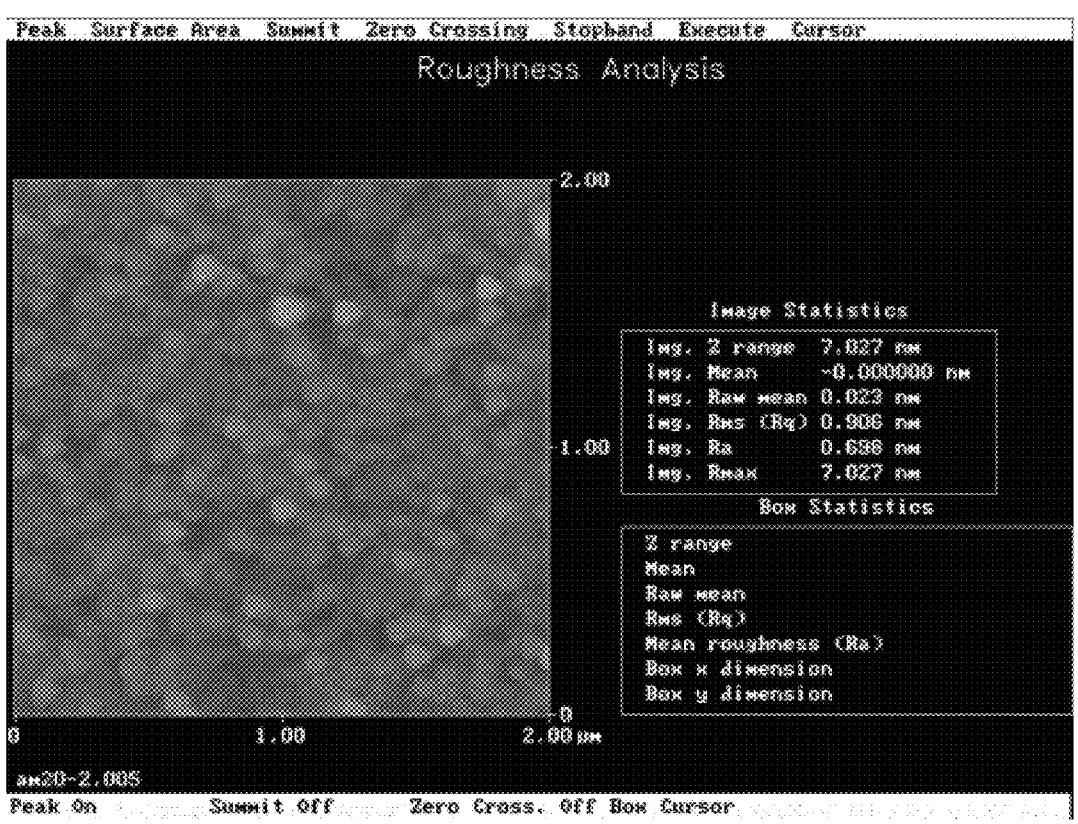
FIG. 16 is an AFM image of the surface of an oblique angle vapor deposited film subjected to milling treatment in Example 6.

For the purpose of comparison with JP 2004-99667 A (characteristic surface roughness qR: at least 0.36; $q=2\pi/\lambda$; Rms: root mean square of deviation Δz from average plane of base plate surface), surface roughness was measured and characteristic surface roughness qR was determined with respect to an oblique angle vapor deposited film having a pitch λ of 27 nm (FIG. 15) and an oblique angle vapor deposited film subjected to ion milling treatment (FIG. 16). The results are shown below.

Oblique Angle Vapor Deposited Layer

Surface roughness Ra: 0.241 nm
Rms: 0.308 nm
Pitch λ: 27 nm
q: 0.233
Characteristic surface roughness qR: 0.072

Oblique Angle Vapor Deposited Layer+Milling Treatment

Surface roughness Ra: 0.698 nm
Rms: 0.906 nm
Pitch λ: 27 nm
q: 0.233
Characteristic surface roughness qR: 0.211

Comparative Example 1

First, a toluene solution (concentration: 1.0 mass %) of PS-r-PMMA-HEMA (number average molecular weight: 36,000) was applied onto the surface of a silicon base plate by spin coating (4000 rpm, 30 seconds), was subjected to thermal annealing treatment for 12 hours at 170° C. under vacuum conditions, and was then subjected to toluene ultrasonic washing for 10 minutes to form a random copolymer layer of approximately 5 nm in thickness as a neutral layer. A toluene solution (concentration: 1.5 mass %) of PS-b-PMMA (number average molecular weight: 160,000) was applied onto the surface of the formed random copolymer layer by spin coating (4000 rpm, 30 seconds) and the resultant block copolymer layer was subjected to thermal annealing treatment for 12 hours at 240° C. under vacuum conditions to form a pattern with a perpendicularly oriented lamellar structure having a film thickness of approximately 80 nm and a periodicity of 80 nm.

Example 7

Figure 17A:
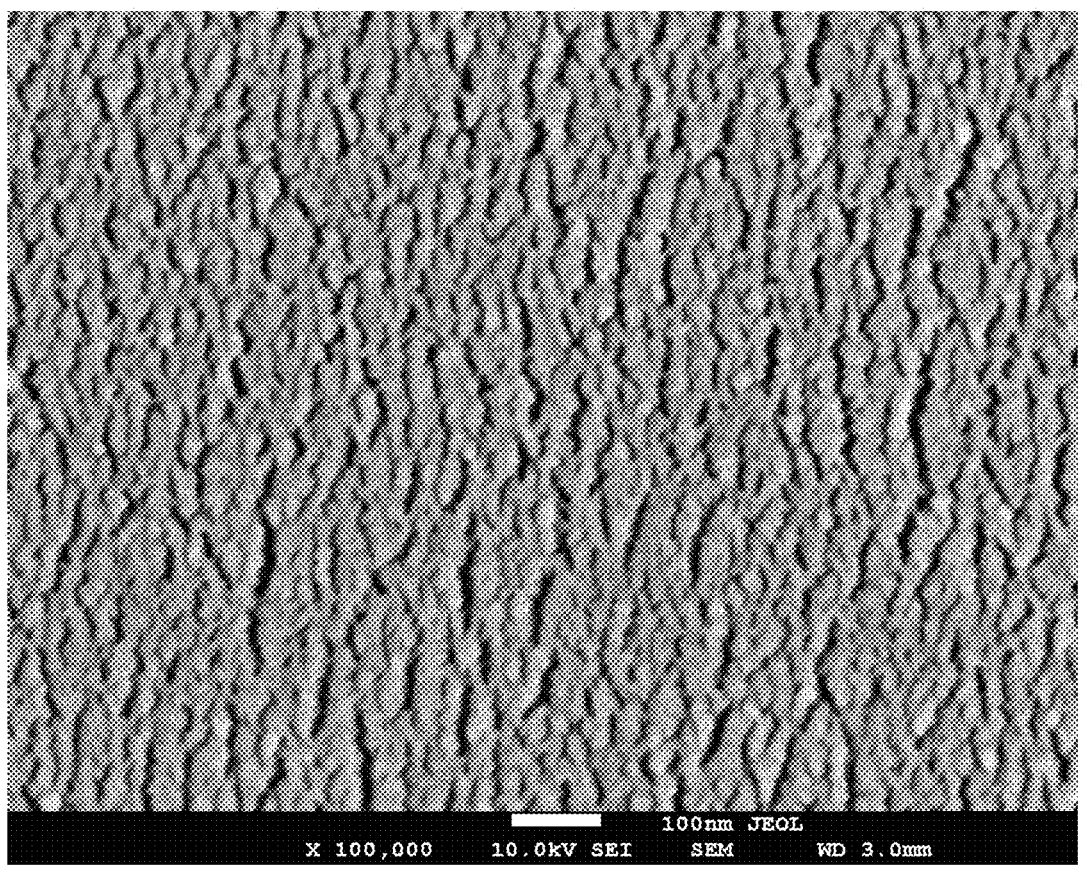
FIG. 17A is an SEM image of the surface of an oblique angle vapor deposited film subjected to Ar milling treatment in Example 7.
Figure 17B:
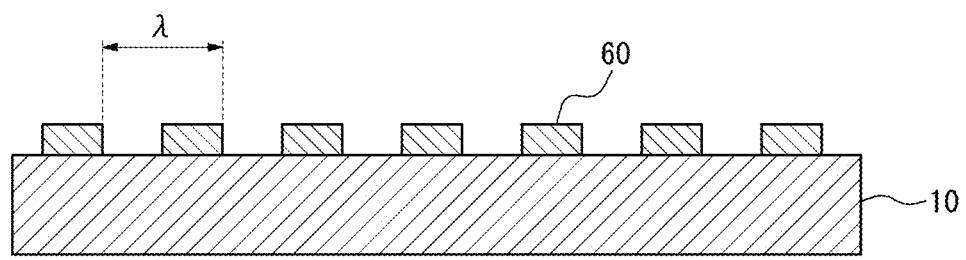
FIG. 17B is a schematic illustration of a cross-section of the oblique angle vapor deposited film subjected to Ar milling treatment in Example 7.
Figure 18A:
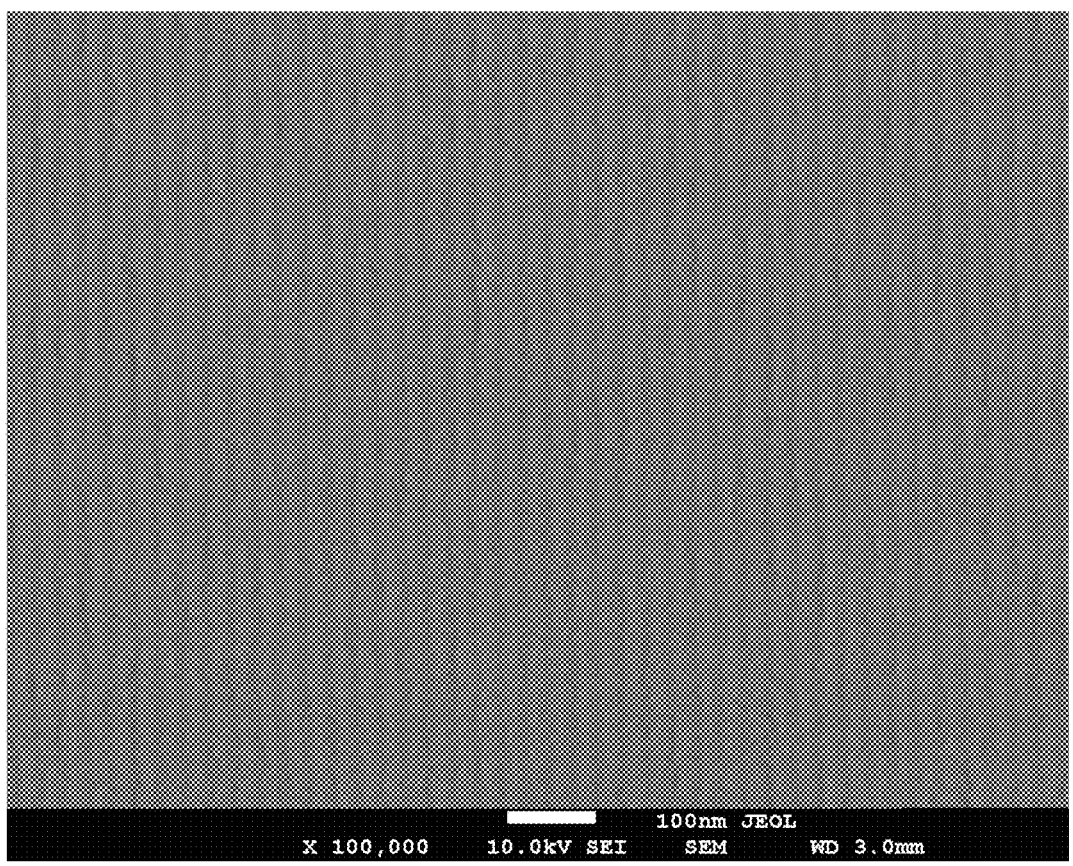
FIG. 18A is an SEM image of the surface of a pattern with a perpendicularly oriented lamellar structure formed in Example 7.
Figure 18B:
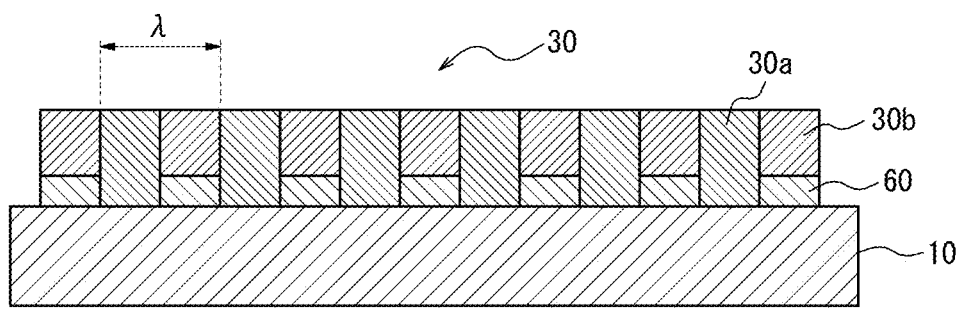
FIG. 18B is a schematic illustration of a cross-section of the pattern with a perpendicularly oriented lamellar structure formed in Example 7.

An oblique angle vapor deposited film was formed by vapor depositing $Ta_2O_5$ on the surface of a glass base plate by oblique angle vapor deposition from directions differing by 180° to obtain a 24-layer bundle structure. The angle of oblique angle vapor deposition was 70° relative to a normal to the glass base plate. The formed oblique angle vapor deposited film was subjected to Ar milling treatment for 120 seconds. FIG. 17A is an SEM image of the surface of the oblique angle vapor deposited film subjected to Ar milling treatment and FIG. 17B schematically illustrates a cross-section of the oblique angle vapor deposited film subjected to Ar milling treatment. A toluene solution (concentration: 1.045 mass %) of PS-b-PMMA (produced by Polymer Source Inc.; number average molecular weight: 51,000) was applied onto the surface of the Ar milling treated oblique angle vapor deposited film by spin coating to form a block copolymer layer of 55 nm in thickness. The block copolymer layer was subjected to thermal annealing treatment for 12 hours at 240° C. under vacuum conditions to form a pattern with a perpendicularly oriented lamellar structure. FIG. 18A is an SEM image of the surface of the pattern with a perpendicularly oriented lamellar structure that was formed and FIG. 18B schematically illustrates a cross-section of the pattern with a perpendicularly oriented lamellar structure that was formed.

Note that although the periodicity of the vapor deposited film guide pattern and the structure periodicity of the PS-b-PMMA were equal (both 27 nm) in Example 7, a similar aligned pattern can be formed using a block copolymer with which a structure periodicity is obtained that is a multiple or factor of the periodicity of the guide pattern (i.e., equal to the periodicity of the guide pattern multiplied or divided by an integer).

INDUSTRIAL APPLICABILITY

Through use of a substrate equipped with an oblique angle vapor deposited film disposed over a large area and having a structure that is controlled on a nanoscale, it is possible to produce a block copolymer layer with a perpendicularly oriented lamellar structure in accordance with the molecular weight and type of the block copolymer. The surface state of the oblique angle vapor deposited film can be controlled through the oblique angle vapor deposition conditions and the type of material. In one possible application of this method, the shadowing effect of oblique angle vapor deposition may be exploited to enable formation of a pattern with a perpendicularly oriented lamellar structure only at desired positions (FIG. 4C). This method may be adopted in various technical fields in which there is demand for nanoscale precision to enable production of large area devices subjected to fine processing (for example, various MEMS elements and polarized light control elements such as polarizing plates and wave plates).

The presently disclosed diffraction limited optical element can be adopted in a wide range of applications and is particularly suitable for use in a retardation plate or a polarizing plate.

The invention claimed is:

1. A block copolymer pattern formation method for forming a block copolymer pattern on a substrate, comprising:
   forming an oblique angle vapor deposited film on the substrate;
   applying a block copolymer onto the oblique angle vapor deposited film that has been formed; and
   subjecting the block copolymer that has been applied to perpendicularly oriented lamellar structure development post-treatment to form a pattern with a perpendicularly oriented lamellar structure, wherein
   in the forming of the oblique angle vapor deposited film:
   the oblique angle vapor deposited film is layered repeatedly from two vapor deposition directions differing from each other by 180°; and
   a line-and-space pattern is formed at the surface of the oblique angle vapor deposited film that has been layered.

2. The block copolymer pattern formation method according to claim 1, wherein
   the perpendicularly oriented lamellar structure development post-treatment is energy imparting treatment or solvent annealing treatment.

3. The block copolymer pattern formation method according to claim 1, wherein
   the energy imparting treatment is one selected from the group consisting of thermal annealing treatment, photoirradiation treatment, and voltage application treatment.

4. The block copolymer pattern formation method according to claim 1, wherein
   the substrate includes one or more protruding portions, and
   in the forming of the oblique angle vapor deposited film, the oblique angle vapor deposited film is only formed on the protruding portions.

5. The block copolymer pattern formation method according to claim 1, wherein
   the line-and-space pattern has a pitch of no greater than 100 nm.

6. The block copolymer pattern formation method according to claim 1, wherein
   the oblique angle vapor deposited film is a film formed from at least one selected from the group consisting of an oxide of Si, an oxide of Ta, and an oxide of Ti.

7. The block copolymer pattern formation method according to claim 1, further comprising
   ion milling the oblique angle vapor deposited film by irradiation with an ion beam after the forming of the oblique angle vapor deposited film.

8. The block copolymer pattern formation method according to claim 1, wherein
   the block copolymer is a diblock copolymer formed from two types of polymers.

* * * * *